(12) United States Patent
Suzuki et al.

(10) Patent No.: US 9,090,990 B2
(45) Date of Patent: Jul. 28, 2015

(54) MANUFACTURING APPARATUS AND METHOD FOR SEMICONDUCTOR DEVICE

(75) Inventors: Kunihiko Suzuki, Shizuoka-ken (JP); Hironobu Hirata, Mishima (JP)

(73) Assignee: NuFlare Technology, Inc., Shizuoka-ken (JP)

( * ) Notice: Subject to any disclaimer, the term of this patent is extended or adjusted under 35 U.S.C. 154(b) by 612 days.

(21) Appl. No.: 13/473,275

(22) Filed: May 16, 2012

(65) Prior Publication Data

US 2012/0291697 A1 Nov. 22, 2012

(30) Foreign Application Priority Data

May 19, 2011 (JP) .................................. 2011-112099

(51) Int. Cl.
| | |
|---|---|
| *C30B 25/10* | (2006.01) |
| *C30B 25/12* | (2006.01) |
| *C23C 16/458* | (2006.01) |
| *C23C 16/46* | (2006.01) |

(52) U.S. Cl.
CPC .............. *C30B 25/10* (2013.01); *C23C 16/4584* (2013.01); *C23C 16/4586* (2013.01); *C23C 16/46* (2013.01); *C30B 25/12* (2013.01)

(58) Field of Classification Search
CPC combination set(s) only.
See application file for complete search history.

(56) References Cited

U.S. PATENT DOCUMENTS

| | | | |
|---|---|---|---|
| 6,506,252 B2 * | 1/2003 | Boguslavskiy et al. | ........ 117/200 |
| 6,740,853 B1 * | 5/2004 | Johnson et al. | ............ 219/444.1 |
| 2006/0130763 A1 * | 6/2006 | Emerson et al. | ............... 118/725 |
| 2007/0221657 A1 | 9/2007 | Arai et al. | |

FOREIGN PATENT DOCUMENTS

| | | |
|---|---|---|
| JP | 2007-88324 | 4/2007 |
| JP | 2007-288163 | 11/2007 |

OTHER PUBLICATIONS

Notification of Reason(s) for Refusal issued by the Japanese Patent Office on Dec. 16, 2014, for Japanese Patent Application No. 2011-112099, and English-language translation thereof.

* cited by examiner

*Primary Examiner* — Duy Deo
*Assistant Examiner* — Erin Bergner
(74) *Attorney, Agent, or Firm* — Finnegan, Henderson, Farabow, Garrett & Dunner, L.L.P.

(57) ABSTRACT

An apparatus for manufacturing a semiconductor device includes an out-heater including a heater element formed in an annular shape with a disconnected portion at one place, a first electrode component connected to a first heater electrode part of the heater element, a second electrode component connected to a second heater electrode part of the heater element, and a base including a first groove in which the first electrode component is fixedly disposed, and a second groove in which the second electrode component is movably disposed and a groove width in a circumferential direction of the heater element is formed such that a width of a second gap formed between a side of the second electrode component and an inner wall of the groove is wider than a width of a first gap formed between a side of the first electrode component and an inner wall of the first groove.

10 Claims, 3 Drawing Sheets

MANUFACTURING APPARATUS AND METHOD FOR SEMICONDUCTOR DEVICE

CROSS-REFERENCE TO RELATED APPLICATION

This application is based upon and claims the benefit of priority from the prior Japanese Patent Application No. 2011-112099 filed on May 19, 2011, the entire contents of which are incorporated herein by reference.

BACKGROUND

The present invention relates to an apparatus and method for manufacturing a semiconductor device, which are used to perform a film formation, for example, by supplying reaction gas to a surface of a semiconductor wafer while heating from a backside of the semiconductor wafer.

Recently, due to the request of price reduction and high performance of semiconductor devices, quality enhancement such as improved film thickness uniformity or the like has been required together with high productivity in a film formation process.

A backside heating method has been employed, which supplies process gas using a single-wafer type epitaxial film formation apparatus, for example, while rotating at a high speed of 900 rpm or more within a reaction chamber, and heats from a backside using a heater.

Generally, a heater element constituting a heater is fixed and connected to an electrode component being a base inside the surface of the heater element by using a bolt or the like. However, since heat causes the deformation of the connected region or the increase of resistance accordingly, a heater electrode part integrated with a heater element is provided and connected to an electrode component below the heater element.

Generally, a heater is mainly provided with an in-heater configured to heat a wafer and an out-heater configured to prevent a temperature decrease (heat loss) from an outer periphery of a wafer.

In the in-heater, a heater element with a slit engraved in a circular flat plate is used, and a heater electrode part is provided at a symmetrical position centering on the heater element. When the slit is engraved, for example, at an angle of 90° with respect to a center line connecting the heater electrode part, a deformation due to a temperature increase occurs in a direction of the center line. Since the heater electrode part, for example, is provided with a gap between a bolt for fixing to the elect rode component and a connected region, the heater electrode part moves while following the deformation of the heater element, so that the damage of the heater element may be prevented.

On the other hand, in the out-heater, a heater element having an annular shape with a disconnected portion at one place (C-shape) is used, and heater electrode parts are provided in parallel at both end portions. Therefore, the deformation of the heater element due to a temperature increase occurs in a direction (circumferential direction) in which the end portions expand.

Recently, due to an increase in temperature of a film formation process, a deformation amount of a heater element increases. For this reason, the following of a heater electrode part in a circumferential direction is difficult, and therefore, the heater element may be damaged, or the heater element or the heater electrode part may contact an adjacent member to cause short circuit. In other words, productivity is lowered and it is difficult to perform a stable and excellent film formation.

Therefore, the invention is directed to provide an apparatus and method for manufacturing a semiconductor device, in which a heater electrode part follows a circumferential-direction deformation of a heater element of an out-heater, so that the heater element or the heater electrode part may be prevented from being damaged or contacted with an adjacent member.

SUMMARY

According to an aspect of the invention, an apparatus for manufacturing a semiconductor device includes a reaction chamber into which a wafer is loaded; a gas supply mechanism configured to supply process gas to the reaction chamber; a gas discharge mechanism configured to discharge gas from the reaction chamber; a wafer support member configured to place the wafer within the reaction chamber; a rotation driving control mechanism configured to rotate the wafer along with the wafer support member; an out-heater including a heater element formed in an annular shape with a disconnected portion at one place and configured to heat the wafer support member to a predetermined temperature, a first heater electrode part integrally formed at one end portion of the heater element, and a second heater electrode part integrally formed at the other end portion of the heater element; a first electrode component connected to the first heater electrode part; a second electrode component connected to the second heater electrode part; and a base including a first groove in which the first electrode component is fixedly disposed, and a second groove in which the second electrode component is movably disposed and a groove width in a circumferential direction of the heater element is formed such that a width of a second gap formed between a side of the second electrode component and an inner wall of the groove is wider than a width of a first gap formed between a side of the first electrode component and an inner wall of the first groove.

According to another aspect of the invention, a method for manufacturing a semiconductor device includes introducing a wafer into a reaction chamber and placing the wafer on a wafer support member; applying a voltage to a first heater electrode part and a second heater electrode part provided under the wafer support member and integrally formed at both end portions of a circular heater element with a disconnected portion at one place, and heating the heater element such that the wafer support member is heated to a predetermined temperature; moving the second heater electrode part to follow the heater element deformed with the heating on a base including a first groove in which the first electrode component is fixedly disposed, and a second groove in which the second electrode component is movably disposed and a groove width in a circumferential direction of the heater element is formed such that a width of a second gap formed between a side of the second electrode component and an inner wall of the groove is wider than a width of a first gap formed between a side of the first electrode component and an inner wall of the first groove; and rotating the wafer and supplying process gas on the wafer to form an epitaxial film on the wafer.

DETAILED DESCRIPTION

Reference will now be made in detail to the present embodiment of the invention, an example of which is illustrated in the accompanying drawings.

Figure 1:
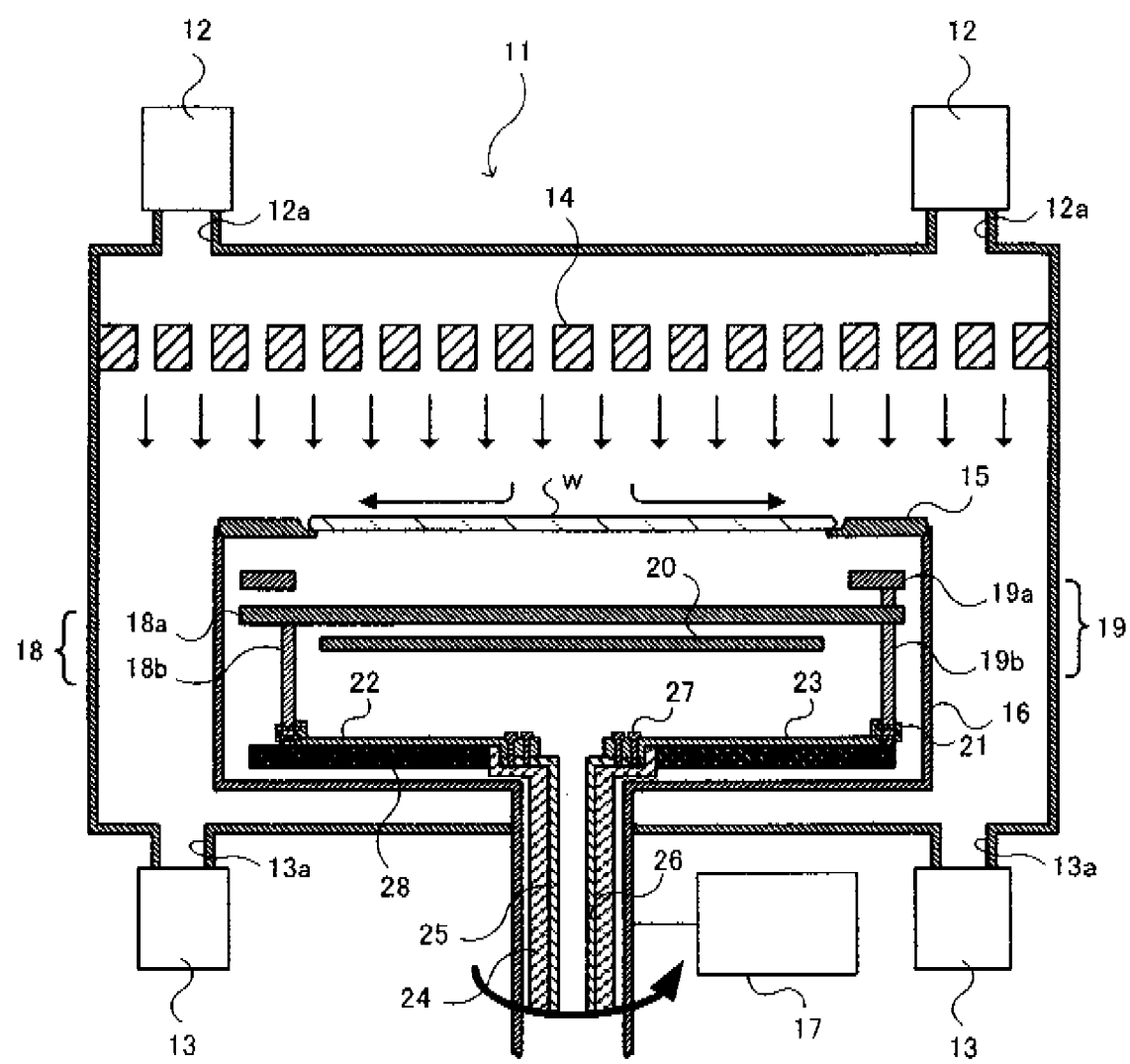
FIG. 1 is a cross-sectional view illustrating a configuration of a semiconductor apparatus according to an embodiment of the invention.

FIG. 1 is a cross-sectional view illustrating a configuration of a semiconductor apparatus according to an embodiment of the invention. As illustrated in FIG. 1, in a reaction chamber 11 in which a film formation processing is performed on, for example, a φ150 mm GaN wafer w, a quartz cover (not illustrated) is provided to cover an inner wall of the reaction chamber 11, if necessary.

At an upper portion of the reaction chamber 11, a gas supply port 12a connected to a process gas supply mechanism 12 for supplying process gas, including source gas and carrier gas, is provided. Under the reaction chamber 11, for example, at two places, a gas discharge port 13a connected to a gas discharge mechanism 13 for discharging gas and controlling a pressure inside the reaction chamber 11 at a constant level (normal pressure) is provided.

Under the gas supply port 12a, a refinery plate 14 having fine through-holes for supplying the supplied process gas after refinery is provided.

Under the refinery plate 14, a support member for placing the wafer w, for example, a susceptor 15 made of SiC, is provided. The susceptor 15 is installed on a ring 16 that is a rotatable member. The ring 16 is connected to a rotation driving control mechanism 17, which is configured by a motor or the like, through a rotational shaft for rotating the wafer w at a predetermined rotational speed.

At the inside of the ring 16, a heater for heating the wafer w is provided. For example, the heater includes an in-heater 18 and an out-heater 19, each of which is made of SiC and connected to a temperature control mechanism (not illustrated). A circular reflector 20 is installed to reflect heat downward from the in-heater 18 and the out-heater 19 and efficiently heat the wafer w.

The in-heater 18 includes a heater element 18a and a heater electrode part 18b. The heater electrode part 18b is integrally molded with the heater element 18a. Also, the out-heater 19 includes a circular heater element 19a having one gap, and a heater electrode part 19b integrally molded with the heater element 19a. Each of the heater electrode parts 18b and 19b is made of SiC having a conductive property due to the addition of impurities. Each of the heater electrode parts 18b and 19b is further coated with a SiC film. Also, the heater electrode parts 18b and 19b are provided at two places.

At an internal lower portion of the ring 16, bus bars 22 and 23 that are electrode components are installed. The bus bars 22 and 23 are formed in a rod shape and are connected to the heater electrode parts 18b and 19b by bolts 21 or the like, respectively. The bus bars 22 and 23 are made of carbon and are further coated with SiC films. The bus bars 22 and 23 are fixed to a heater shaft 24. The bus bars 22 and 23 are connected to electrode rods 25 and 26 by bolts 27 or the like. The electrode rods 25 and 26 are connected to an external power supply (not illustrated) under the heater shaft 24. The electrode rods 25 and 26 are made of molybdenum or the like.

Under the bus bar 22, for example, a quartz base 28 is provided. The base 28 is provided with a groove.

Figure 2A:
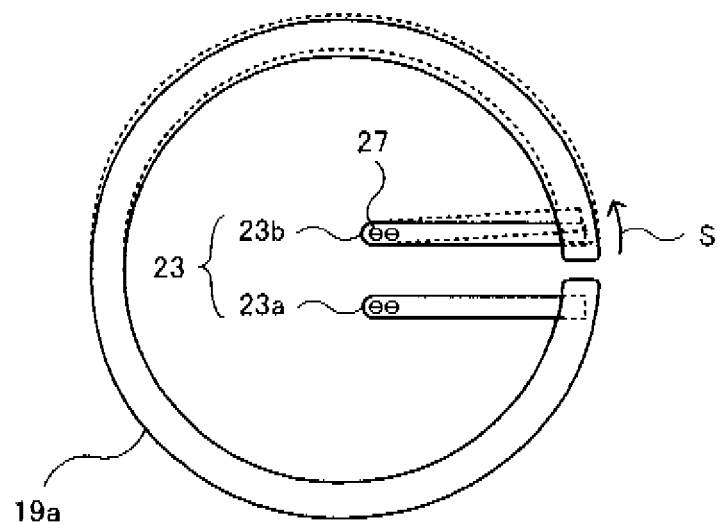
FIG. 2A is a top view of an out-heater illustrated in FIG. 1.
Figure 2B:
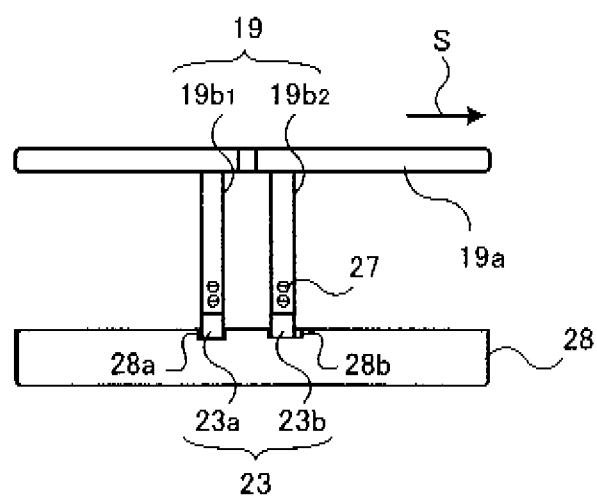
FIG. 2B is a side view of the out-heater illustrated in FIG. 1.
Figure 3A:
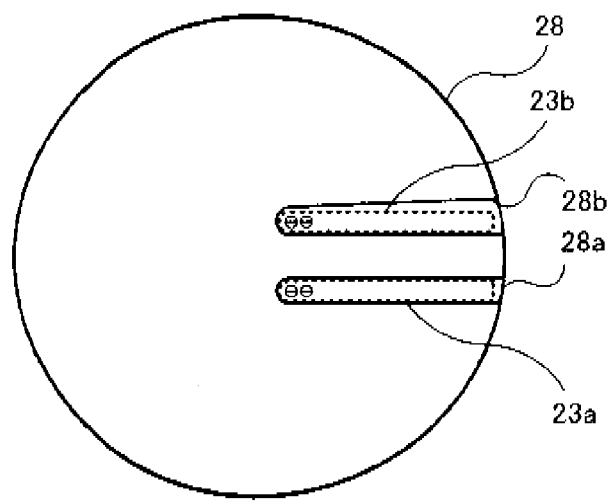
FIG. 3A is a top view of a base illustrated in FIG. 1.
Figure 3B:
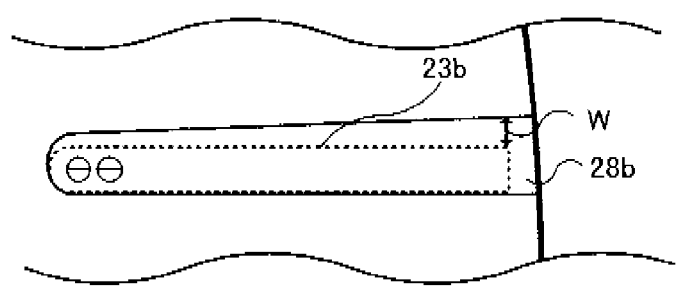
FIG. 3B is an enlarged view of surroundings around a second groove illustrated in FIG. 3A.

FIG. 2A is a top view of the out-heater 19 illustrated in FIG. 1. Also, FIG. 2B is a side view of the out-heater 19 illustrated in FIG. 1. FIG. 3A is a top view of the base 28 illustrated in FIG. 1. FIG. 3B is an enlarged view of surroundings around a second groove illustrated in FIG. 3A. As illustrated in these drawings, at each end portion of the heater element 19b of the out-heater 19, heater electrode parts $19b_1$ and $19b_2$ are integrally formed. The heater electrode parts $19b_1$ and $19b_2$ are connected to the bus bars 23a and 23b, respectively. The bus bars 23a and 23b are connected to electrode rods 26a and 26b. At the base 28, grooves 28a and 28b, in which the bus bars 23a and 23b are disposed, are formed. The groove 28a is provided for determining the position of the bus bar 23a, that is, setting the heater installation standard. The bus bar 23a is fixed to the inside of the groove.

Herein, in order to heat the wafer w to about 1700° C., which is a film formation temperature of GaN, it is necessary to heat the heater element 19a to about 1800° C. At such a high temperature, the heater element 19a is greatly deformed. In this case, the heater element 19a is deformed in a direction (circumferential direction) S in which the gap is opened. Therefore, if the bus bar 23b is fixed to the base 28, the upper portion of the heater electrode part 19b tries to follow the movement to the circumferential direction S. A part indicated by a broken line in FIG. 2A represents a position after the deformation of the heater element 19a. However, if the heater electrode part 19b connected to a lower portion of the heater element 19a is fixed to the bus bar 23b, the heater element 19a or the heater electrode part 19b may be damaged.

Therefore, in the present embodiment, the groove 28b is formed to be larger in dimension than the bus bar 23b, so that a gap is provided between the groove 28b and the bus bar 23b. The size or shape of the gap is previously calculated by analyzing a direction, distance, or the like, in which the bus bar 23b moves while following the deformation of the heater at a film formation temperature. As in the present embodiment, when a film formation is performed using a φ150 mm wafer w at a wafer temperature of 1700° C., a width W of the gap at an outer peripheral end portion of the bus bar 23b may be, for example, 1.5 to 2.5 mm.

Figure 4:
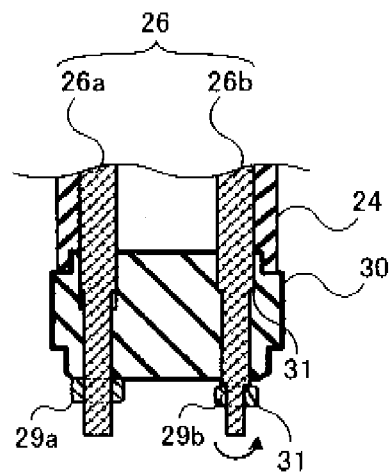
FIG. 4 is a cross-sectional view illustrating a lower portion of an electrode rod and a heater shaft illustrated in FIG. 1.

FIG. 4 is a cross-sectional view illustrating a lower portion of a heater shaft 24. As illustrated in FIG. 4, the electrode rod 26a is fixed to a Teflon (registered trademark) pipe 30 by a nut 29a. Also, the electrode rod 26b is provided with shoulder parts 31 at two places, that is, upper and lower places. The nut 29b is stopped at the lower shoulder part 31 and is in a state that it is not tightly fastened to the Teflon (registered trademark) pipe 30. On the other hand, the upper shoulder part 31 is in a state that it is placed on the Teflon (registered trademark) pipe 30. Therefore, the electrode rod 26a forms a minute gap between the heater electrode part $19b_2$ and the base 28, and is fixed to the Teflon (registered trademark) pipe 30 by the nut 29b. The electrode rod 26b is rotatable. Also, as described above, the upper end portion of the electrode rod 26a is connected to the bus bar 23a in the vicinity of the rotational central shaft. The upper end portion of the electrode rod 26b is connected to the bus bar 23b in the vicinity of the rotational central shaft.

As such, since the minute gap is formed between the heater electrode part $19b_2$ and the base 28, the bus bar 23b is rotatable around the electrode rod 26b by the operation of the upper shoulder part 31 of the electrode rod 26b placed on the Teflon (registered trademark) pipe 30. In other words, the heater electrode part 19$b_2$, the bus bar 23$b$, and the electrode rod 26$b$ may follow the deformation of the heater element 19$a$.

Using such an apparatus for manufacturing a semiconductor device, a GaN epitaxial film is formed on the wafer w. Hereinafter, the procedures are described.

First, the wafer w is carried into the reaction chamber 11 by a transfer arm (not illustrated) or the like, and is placed on the susceptor 15.

Then, the in-heater 18 and the out-heater 19 are set to, for example, 1800° C. by the temperature control mechanism. While the in-heater 18 and the out-heater 19 heat the wafer w to, for example, 1,650° C., the wafer w is rotated at, for example, 900 rpm by the rotation driving control mechanism 17.

Process gas, which is mixed by control of a flow rate with the process gas supply mechanism 12, is supplied on the wafer w in a refined state through the refinery plate 14. For the process gas, for example, as source gas, ammonia ($NH_3$): trimethylgallium (TMGa) is diluted at a predetermined concentration by argon gas (Ar) and is supplied at, for example, 50 SLM:50 SLM, respectively.

In this case, in the out-heater 19, the heater element 19$a$ is deformed in a direction (circumferential direction) in which the gap is opened with a temperature increase. While following the deformation, the heater electrode part 19$b_2$ moves in a circumferential direction, and the bus bar 23$b$ and the electrode rod 26$b$ are also rotated.

On the other hand, excessive process gas and exhaust gas including a reaction by-product are discharged from the gas discharge port 13$a$ through the gas discharge mechanism 13, so that a pressure inside the reaction chamber 11 is controlled at a constant level (for example, normal pressure).

By this manner, a GaN epitaxial film is grown on the wafer w.

According to the present embodiment, in the out-heater 19, the heater electrode part 19$b_2$, the bus bar 23$b$, and the electrode rod 26$b$ may follow the deformation due to the temperature increase of the heater element 19$a$. This can prevent the heater element or the heater electrode part from being damaged or contacted with an adjacent member. A reduction of productivity can be suppressed, and a stable and excellent film formation can be carried out.

A film, such as an epitaxial film or the like, can be stably formed on the semiconductor wafer w with high productivity. With improvement in the yield of wafers, the yield of semiconductor devices manufactured through a device formation process and a device isolation process can be improved, and device characteristics can be stabilized. In particular, excellent device characteristics can be obtained by applying to an epitaxial formation process of power semiconductor devices, such as power MOSFET or IGBT, which need to be grown to a film thickness of 100 μm or more in an N-type base area, a P-type base area an insulating isolation area, or the like.

Although the formation of the GaN epitaxial film has been described above in the present embodiment, the invention can also be applied to a compound semiconductor such as SiC. Also, the invention can also be applied to a Si epitaxial film. In this case, in order to form a thick film at a high rate, dichlorosilane ($SiH_2C_{12}$) is used as the process gas and a film formation temperature is about 1000 to 1100° C. Therefore, the temperature of the heater element 19$a$ needs to be set to about 1300 to 1400° C. In such a case, the gap in the outer peripheral end portion of the bus bar 23$b$ may be, for example, 1.0 to 2.0 mm in the φ150 mm wafer w.

Also, the present embodiment can also be applied to the formation of epitaxial layers, poly Si layers, insulation films, such as a $SiO_2$ layer or a $Si_3N_4$ layer, of compound semiconductors, such as GaAlAs or InGaAs, aside from GaN and SiC. Various modifications can be made without departing from the scope of the invention.

What is claimed is:

1. An apparatus for manufacturing a semiconductor device, comprising:
    a reaction chamber into which a wafer is loaded;
    a gas supply mechanism configured to supply process gas to the reaction chamber;
    a gas discharge mechanism configured to discharge gas from the reaction chamber;
    a wafer support member configured to place the wafer within the reaction chamber;
    a rotation driving control mechanism configured to rotate the wafer along with the wafer support member;
    an out-heater including a heater element formed in an annular shape with a disconnected portion at one place and configured to heat the wafer support member to a predetermined temperature, a first heater electrode part integrally formed at one end portion of the heater element so as to project from a rear surface of the heater element, and a second heater electrode part integrally formed at the other end portion of the heater element so as to project from the rear surface of the heater element;
    a first electrode component connected to an end portion of the first heater electrode part, the first electrode component being positioned away from the heater element;
    a second electrode component connected to an end portion of the second heater electrode part, the second electrode component being positioned away from the heater element; and
    a base including a first groove in which the first electrode component is fixedly disposed, and a second groove in which the second electrode component is movably disposed and a groove width in a circumferential direction of the heater element is formed so as to be wider than a width of the second electrode component, the base being positioned away from the heater element.

2. The apparatus according to claim 1, further comprising:
    a first electrode rod and a second electrode rod connected to the first electrode component and the second electrode component in an end portion of a rotational central shaft side of the wafer, respectively,
    wherein the second electrode rod is rotatable while following a deformation of the out-heater.

3. The apparatus according to claim 1,
    wherein the width of the second gap in an outer peripheral end portion of the second electrode component is 1.0 to 2.5 mm.

4. The apparatus according to claim 2,
    wherein the base is disposed in parallel under the out-heater,
    the first heater electrode part and the second heater electrode part are disposed in a vertical direction with respect to the base and the out-heater, and
    the first electrode component and the second electrode component are rod-shaped bus bars and are connected to lower end portions of the first heater electrode part and the second heater electrode part, respectively.

5. The apparatus according to claim 2,
    wherein the width of the second gap in an outer peripheral end portion of the second electrode component is 1.0 to 2.5 mm.

6. The apparatus according to claim 5,
    wherein the base is disposed in parallel under the out-heater, the first heater electrode part and the second heater electrode part are disposed in a vertical direction with respect to the base and the out-heater, and the first electrode component and the second electrode component are rod-shaped bus bars and are connected to lower end portions of the first heater electrode part and the second heater electrode part, respectively, 7. The apparatus according to claim 2,
wherein both end portions of the first electrode rod are fixed.

8. The apparatus according to claim 7,
wherein the width of the second gap in an outer peripheral end portion of the second electrode component is 1.0 to 2.5 mm.

9. The apparatus according to claim 8,
wherein the base is disposed in parallel under the out-heater, the first heater electrode part and the second heater electrode part are disposed in a vertical direction with respect to the base and the out-heater, and the first electrode component and the second electrode component are rod-shaped bus bars and are connected to lower end portions of the first heater electrode part and the second heater electrode part, respectively.

10. An apparatus for manufacturing a semiconductor device, comprising:

a reaction chamber into which a wafer is loaded;

a gas supply mechanism configured to supply process gas to the reaction chamber;

a gas discharge mechanism configured to discharge gas from the reaction chamber;

a susceptor configured to place the wafer within the reaction chamber;

a rotation driving control mechanism configured to rotate the wafer along with the susceptor;

an out-heater including a heater element formed in an annular shape with a disconnected portion at one place and configured to heat the susceptor to a predetermined temperature, a first heater electrode part integrally formed at one end portion of the heater element so as to project from a rear surface of the heater element, and a second heater electrode part integrally formed at the other end portion of the heater element so as to project from the rear surface of the heater element;

a first bus bar connected to an end portion of the first heater electrode part, the first bus bar being positioned away from the heater element;

a second bus bar connected to an end portion of the second heater electrode part, the second bus bar being positioned away from the heater element; and a base including a first groove in which the first bus bar is fixedly disposed, and a second groove in which the second bus bar is movably disposed and a groove width in a circumferential direction of the heater element is formed so as to be wider than a width of the second bus bar, the base being positioned away from the heater element.

* * * * *